United States Patent
Mori et al.

(10) Patent No.: US 11,273,639 B2
(45) Date of Patent: Mar. 15, 2022

(54) LIQUID EJECTING HEAD, LIQUID EJECTING APPARATUS, AND ELECTRONIC DEVICE

(71) Applicant: SEIKO EPSON CORPORATION, Tokyo (JP)

(72) Inventors: Masaki Mori, Shiojiri (JP); Eiju Hirai, Azumino (JP); Motoki Takabe, Shiojiri (JP)

(73) Assignee: Seiko Epson Corporation, Tokyo (JP)

(*) Notice: Subject to any disclaimer, the term of this patent is extended or adjusted under 35 U.S.C. 154(b) by 25 days.

(21) Appl. No.: 16/826,516

(22) Filed: Mar. 23, 2020

(65) Prior Publication Data

US 2020/0307207 A1 Oct. 1, 2020

(30) Foreign Application Priority Data

Mar. 25, 2019 (JP) .............................. JP2019-056130

(51) Int. Cl.
| | | |
|---|---|---|
| *B41J 2/14* | (2006.01) | |
| *H01L 41/09* | (2006.01) | |
| *H01L 41/047* | (2006.01) | |
| *H01L 41/04* | (2006.01) | |

(52) U.S. Cl.
CPC ........ *B41J 2/14201* (2013.01); *H01L 41/042* (2013.01); *H01L 41/0475* (2013.01); *H01L 41/0973* (2013.01)

(58) Field of Classification Search
None
See application file for complete search history.

(56) References Cited

U.S. PATENT DOCUMENTS

| | | | |
|---|---|---|---|
| 2014/0267510 A1* | 9/2014 | Furuya | B41J 2/1645 347/71 |
| 2015/0306876 A1* | 10/2015 | Machida | B41J 2/155 347/71 |
| 2016/0263887 A1 | 9/2016 | Tanaka | |

FOREIGN PATENT DOCUMENTS

JP 2016-165847 A 9/2016

\* cited by examiner

*Primary Examiner* — Erica S Lin
(74) *Attorney, Agent, or Firm* — Workman Nydegger

(57) ABSTRACT

The terminal portion extends onto a surface of the protrusion portion from part positioned in the second layer and corresponding to the second portion, and part on the surface of the protrusion portion contacts an electrode of the drive element.

18 Claims, 11 Drawing Sheets

LIQUID EJECTING HEAD, LIQUID EJECTING APPARATUS, AND ELECTRONIC DEVICE

The present application is based on, and claims priority from JP Application Serial Number 2019-056130, filed Mar. 25, 2019, the disclosure of which is hereby incorporated by reference herein in its entirety.

BACKGROUND

1. Technical Field

The present disclosure relates to a liquid ejecting head, a liquid ejecting apparatus, and an electronic device.

2. Related Art

An electronic device such as a liquid ejecting head which ejects liquid such as ink from a plurality of nozzles has been proposed in the related art. For example, JP-A-2016-165847 discloses a liquid ejecting head including a sealing plate on which wiring for supplying a drive signal to a piezoelectric element causing ink to be ejected from a nozzle is formed, and a drive IC which supplies the drive signal to the piezoelectric element. Power supply wiring formed on the sealing plate and a power supply bump electrode formed on the drive IC are electrically coupled.

In order to ensure sufficient adhesion between the drive IC and the sealing plate, it is necessary to apply an adhesive while avoiding a power supply bump electrode and power supply wiring. In order to ensure a region to which the adhesive is applied, it is necessary to ensure a sufficient gap between the power supply bump electrode and the power supply wiring, which may increase resistance between the bump electrode and the power supply wiring. Although the liquid ejecting head is illustrated for convenience in the above description, a similar problem may occur also in electronic devices other than the liquid ejecting head.

SUMMARY

In order to solve the above problems, according to an aspect of the present disclosure, there is provided a liquid ejecting head including: a first substrate including a mounting surface; a protrusion portion provided on the mounting surface along a first axis; coupling wiring provided on the mounting surface; a second substrate including an installation surface facing the mounting surface with a gap; a drive element provided on the installation surface and causing liquid to be ejected from a nozzle; and a terminal portion overlapping the protrusion portion in plan view, in which the coupling wiring includes a first layer including an extension portion adjacent to the protrusion portion and a second layer stacked on the first layer, the extension portion includes a first portion adjacent to the protrusion portion with a first gap and a second portion adjacent to the protrusion portion with a second gap narrower than the first gap, and the terminal portion extends onto a surface of the protrusion portion from part positioned in the second layer and corresponding to the second portion, and part on the surface of the protrusion portion contacts an electrode of the drive element.

According to another aspect of the present disclosure, there is provided a liquid ejecting head including: a first substrate including a mounting surface; a protrusion portion provided on the mounting surface along a first axis; first coupling wiring and second coupling wiring provided on the mounting surface and positioned opposite to each other with the protrusion portion in between in plan view; a second substrate including an installation surface facing the mounting surface with a gap; a first drive element provided on the installation surface and causing liquid to be ejected from a first nozzle; a second drive element provided on the installation surface and causing liquid to be ejected from a second nozzle; and a first terminal portion and a second terminal portion which overlap the protrusion portion in plan view between the first coupling wiring and the second coupling wiring, in which the first coupling wiring and the second coupling wiring each include a first layer including an extension portion adjacent to the protrusion portion and a second layer stacked on the first layer, the extension portion includes a first portion adjacent to the protrusion portion with a first gap, and a second portion adjacent to the protrusion portion with a second gap narrower than the first gap, the first portion of the first coupling wiring and the second portion of the second coupling wiring are positioned opposite to each other with the protrusion portion in between in plan view, the second portion of the first coupling wiring and the first portion of the second coupling wiring are positioned opposite to each other with the protrusion portion in between in plan view, the first terminal portion extends onto a surface of the protrusion portion from part positioned in the second layer of the first coupling wiring and corresponding to the second portion of the first coupling wiring, and part on the surface of the protrusion portion contacts an electrode of the first drive element, and the second terminal portion extends onto a surface of the protrusion portion from part positioned in the second layer of the second coupling wiring and corresponding to the second portion of the second coupling wiring, and part on the surface of the protrusion portion contacts an electrode of the second drive element.

According to still another aspect of the present disclosure, there is provided a liquid ejecting head including: a first substrate including a mounting surface; a protrusion portion provided on the mounting surface along a first axis; first coupling wiring and second coupling wiring provided on the mounting surface and positioned opposite to each other with the protrusion portion in between in plan view; a second substrate including an installation surface facing the mounting surface with a gap; a drive element provided on the installation surface and causing liquid to be ejected from a nozzle; and a terminal portion which overlaps the protrusion portion in plan view between the first coupling wiring and the second coupling wiring, in which the first coupling wiring and the second coupling wiring each include a first layer including an extension portion adjacent to the protrusion portion and a second layer stacked on the first layer, the extension portion includes a first portion adjacent to the protrusion portion with a first gap, and a second portion adjacent to the protrusion portion with a second gap narrower than the first gap, the first portion of the first coupling wiring and the first portion of the second coupling wiring are positioned opposite to each other with the protrusion portion in between in plan view, the second portion of the first coupling wiring and the second portion of the second coupling wiring are positioned opposite to each other with the protrusion portion in between in plan view, and the terminal portion extends between part positioned in the second layer of the first coupling wiring and corresponding to the second portion of the first coupling wiring and part positioned in the second layer of the second coupling wiring and corresponding to the second portion of the second coupling wiring, and part on a surface of the protrusion portion contacts an electrode of the drive element.

According to still another aspect of the present disclosure, there is provided a liquid ejecting apparatus including the liquid ejecting head according to any of the aspects, and a controller which controls the liquid ejecting head.

According to still another aspect of the present disclosure, there is provided an electronic device including: a first substrate including a mounting surface; a protrusion portion provided on the mounting surface along a first axis; coupling wiring provided on the mounting surface; a second substrate including an installation surface facing the mounting surface with a gap; an electrode provided on the installation surface; and a terminal portion which overlaps the protrusion portion in plan view, in which the coupling wiring includes a first layer including an extension portion adjacent to the protrusion portion and a second layer stacked on the first layer, the extension portion includes a first portion adjacent to the protrusion portion with a first gap, and a second portion adjacent to the protrusion portion with a second gap narrower than the first gap, and the terminal portion extends onto a surface of the protrusion portion from part positioned in the second layer and corresponding to the second portion, and part on the surface of the protrusion portion contacts the electrode.

DESCRIPTION OF EXEMPLARY EMBODIMENTS

A. Embodiment 1

Figure 1:
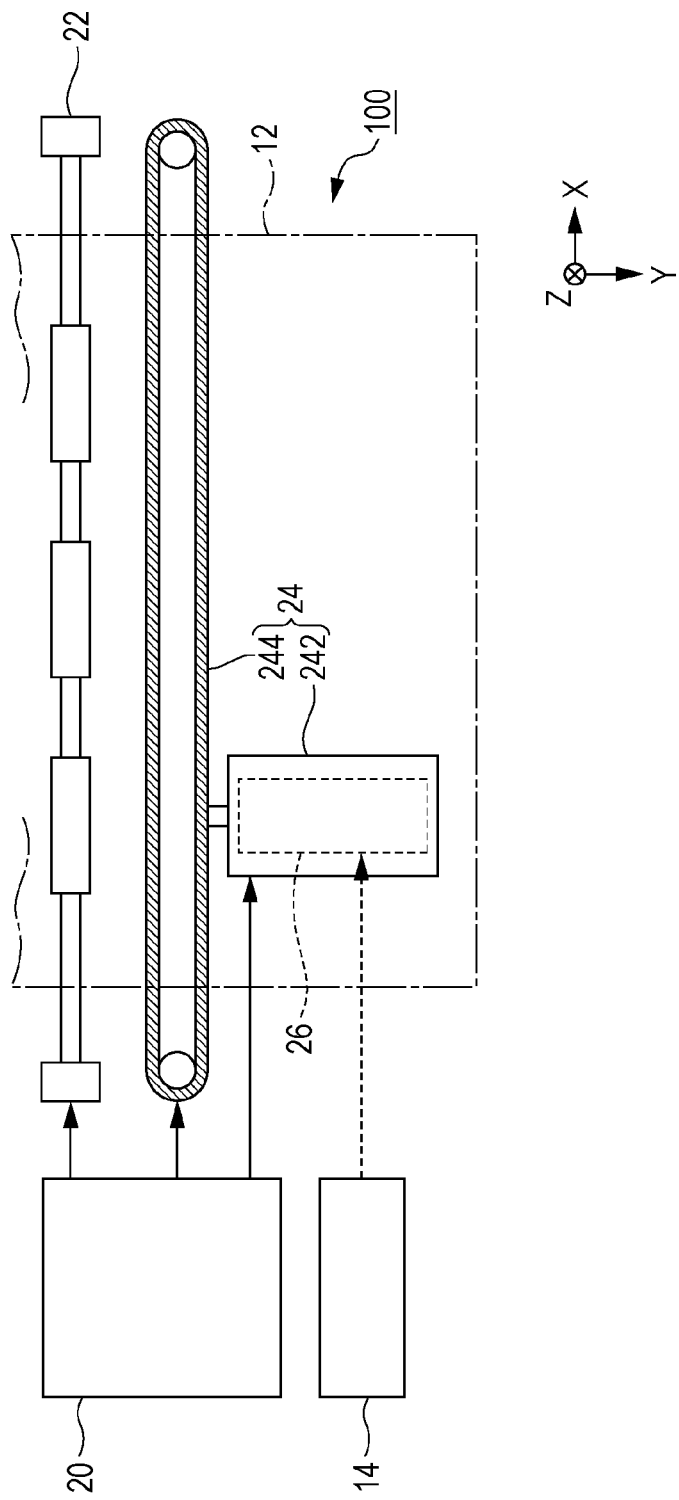
FIG. 1 is a block diagram showing a configuration of a liquid ejecting apparatus according to Embodiment 1.

FIG. 1 is a configuration diagram illustrating a liquid ejecting apparatus 100 according to Embodiment 1. The liquid ejecting apparatus 100 according to Embodiment 1 is an ink jet printing apparatus for ejecting ink, which is an example of a liquid, onto a medium 12. Although the medium 12 is typically printing paper, an object to be printed of an optional material such as a resin film or fabric is used as the medium 12. As illustrated in FIG. 1, the liquid ejecting apparatus 100 is provided with a liquid container 14 for storing ink. For example, a cartridge which can be attached to and detached from the liquid ejecting apparatus 100, a bag-shaped ink pack formed of a flexible film, or an ink tank which can be refilled with ink is used as the liquid container 14. A plurality of types of inks having different colors are stored in the liquid container 14.

As illustrated in FIG. 1, the liquid ejecting apparatus 100 includes a control unit 20, a transport mechanism 22, a moving mechanism 24, and a liquid ejecting head 26. Specifically, the control unit 20 includes a processing circuit such as a central processing unit (CPU) or a field-programmable gate array (FPGA) and a storage circuit such as a semiconductor memory, and totally controls each element of the liquid ejecting apparatus 100. The control unit 20 is an example of a "controller". The transport mechanism 22 transports the medium 12 along a Y-axis under control of the control unit 20. The Y-axis is an example of a "first axis".

The moving mechanism 24 reciprocates the liquid ejecting head 26 along an X-axis under the control of the control unit 20. The X-axis intersects the Y-axis along which the medium 12 is transported. Typically, a direction perpendicular to the Y-axis is the X-axis. The X-axis is an example of a "second axis". The moving mechanism 24 according to Embodiment 1 includes a substantially box-shaped transport body 242 which accommodates the liquid ejecting head 26 and a transport belt 244 to which the transport body 242 is fixed. A configuration in which a plurality of liquid ejecting heads 26 are mounted on the transport body 242 and a configuration in which the liquid container 14 is mounted on the transport body 242 together with the liquid ejecting head 26 may be employed.

The liquid ejecting head 26 ejects ink supplied from the liquid container 14 onto the medium 12 from a plurality of nozzles under the control of the control unit 20. In parallel with the transport of the medium 12 by the transport mechanism 22 and the repetitive reciprocation of the transport body 242, the liquid ejecting head 26 ejects ink onto the medium 12 and thereby a desired image is formed on a surface of the medium 12. Hereinafter, an axis perpendicular to an X-Y plane is referred to as a Z-axis. The Z-axis is typically a vertical line.

Figure 2:
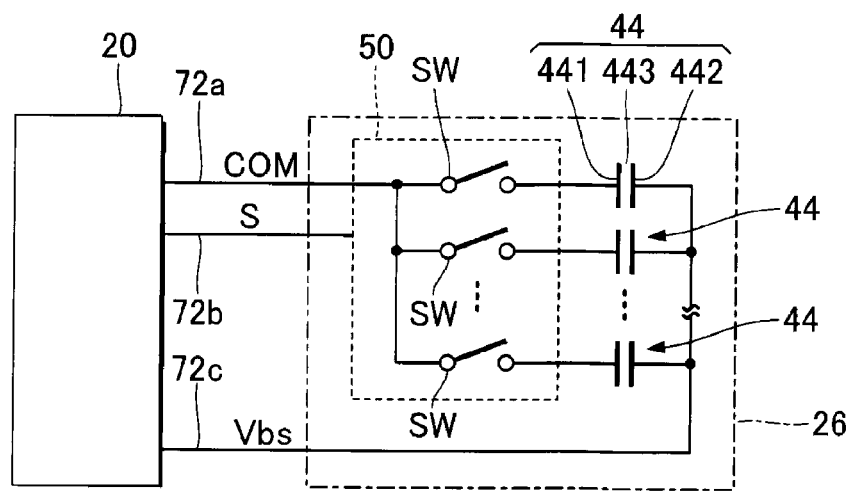
FIG. 2 is a block diagram for illustrating a functional configuration of the liquid ejecting apparatus.
Figure 3:
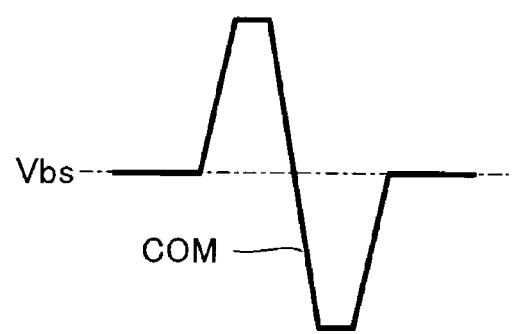
FIG. 3 is a waveform diagram of a drive signal.

FIG. 2 is a block diagram illustrating a functional configuration of the liquid ejecting apparatus 100. Illustrations of the transport mechanism 22 and the moving mechanism 24 are omitted for convenience. As illustrated in FIG. 2, the control unit 20 according to Embodiment 1 supplies a control signal S, a drive signal COM, and a reference voltage Vbs to the liquid ejecting head 26. The control signal S is a signal for indicating whether ink is ejected and an ejection amount for each of the plurality of nozzles. The drive signal COM is a voltage signal that varies in time at a predetermined cycle with reference to the reference voltage Vbs, which is a constant voltage, and is used to cause the liquid ejecting head 26 to eject ink. As illustrated in FIG. 3, the drive signal COM is a voltage signal including a drive pulse at every predetermined cycle. A drive signal COM having a waveform including a plurality of drive pulses may be used.

As illustrated in FIG. 2, the liquid ejecting head 26 according to Embodiment 1 includes a plurality of piezoelectric elements 44 respectively corresponding to a plurality of nozzles, and a drive circuit 50 for driving each of the plurality of piezoelectric elements 44. The piezoelectric element 44 is an example of the "drive element". Specifically, the drive circuit 50 controls supply of the drive signal COM to each of the plurality of piezoelectric elements 44. The drive circuit 50 according to Embodiment 1 includes a plurality of switches SW respectively corresponding to the plurality of piezoelectric elements 44. Each of the plurality of switches SW is configured to function as a transfer gate for switching supply/stop of the drive signal COM to the piezoelectric element 44 according to the control signal S.

Figure 4:
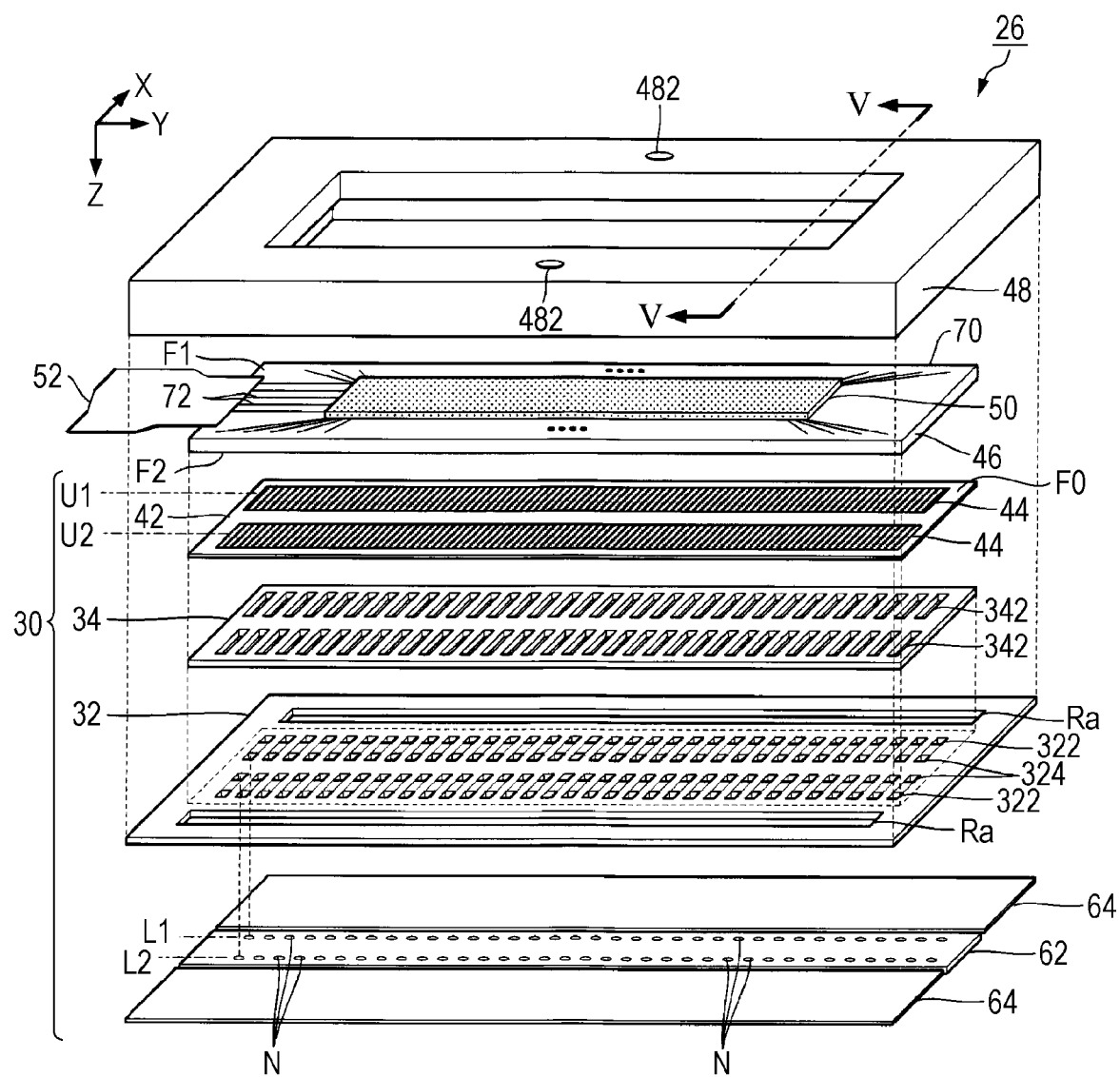
FIG. 4 is an exploded perspective view of a liquid ejecting head.
Figure 5:
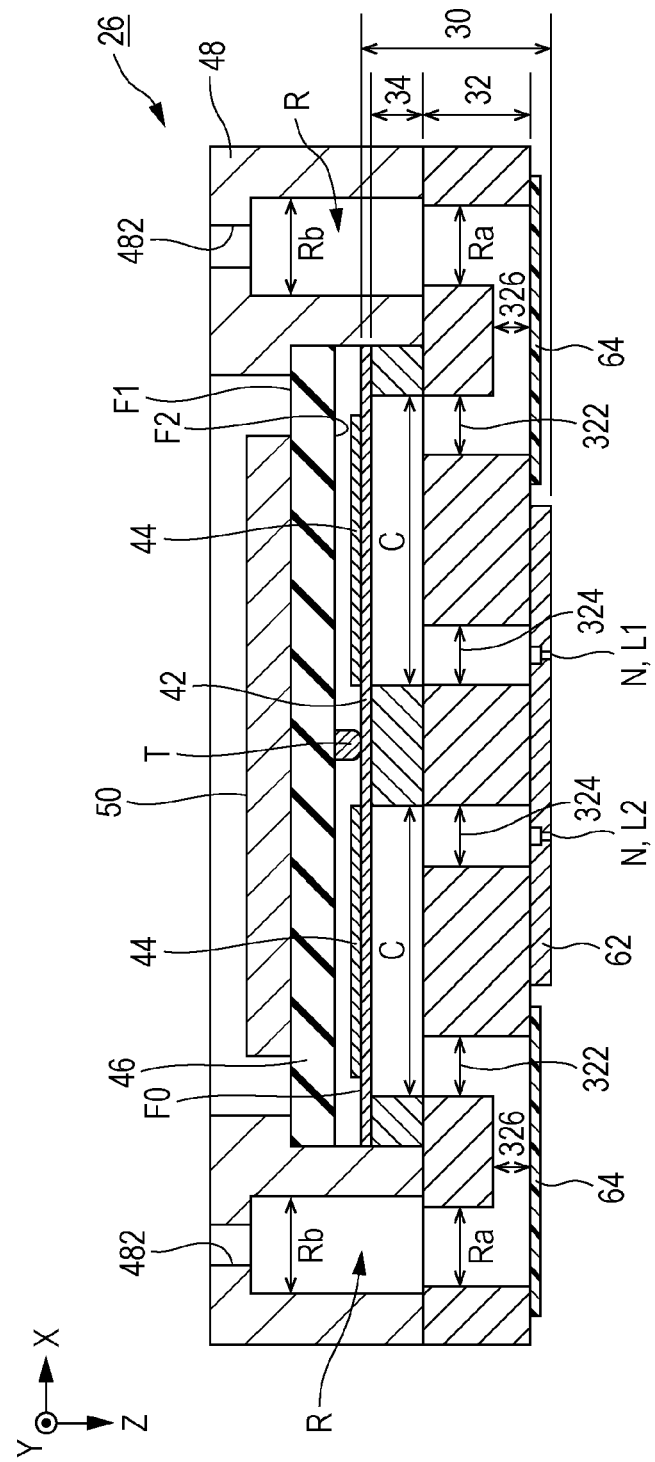
FIG. 5 is a cross-sectional view of the liquid ejecting head (a cross-sectional view taken along line V-V in FIG. 4).

FIG. 4 is an exploded perspective view of the liquid ejecting head 26, and FIG. 5 is a cross-sectional view taken along the line V-V in FIG. 4. As illustrated in FIG. 4, the liquid ejecting head 26 includes a plurality of nozzles N arranged along the Y-axis. The plurality of nozzles N according to Embodiment 1 are disposed in a first row L1 and a second row L2 arranged side by side with a gap in a direction of the X-axis. Each of the first row L1 and the second row L2 is a set of the plurality of nozzles N linearly arranged along the Y-axis. Positions of nozzles N on the Y-axis can be different between the first row L1 and the second row L2. However, a configuration in which the positions of the nozzles N on the Y-axis are matched in the first row L1 and the second row L2 is illustrated below for convenience. The nozzle N in the first row L1 is an example of a "first nozzle", and the nozzle N in the second row L2 is an example of a "second nozzle". As understood from FIG. 5, the liquid ejecting head 26 according to Embodiment 1 has a structure in which element related to each nozzle N of the first row L1 and element related to each nozzle N of the second row L2 are arranged in substantially plane symmetry.

The liquid ejecting head 26 includes a channel substrate 32. As illustrated in FIG. 4, a pressure chamber substrate 34, a vibration plate 42, a wiring substrate 46, a housing portion 48, and the drive circuit 50 are stacked on the channel substrate 32 in a negative direction of the Z-axis. On the other hand, a nozzle plate 62 and a vibration absorber 64 are provided on the channel substrate 32 in a positive direction of the Z-axis. Each element of the liquid ejecting head 26 is substantially a plate-shaped member which is long along the Y-axis, and is joined to each other by using, for example, an adhesive. A channel structure 30 is configured to include the channel substrate 32, the pressure chamber substrate 34, the vibration plate 42, the nozzle plate 62, and the vibration absorber 64. The wiring substrate 46 faces the channel structure 30. The channel structure 30 is an example of a "second substrate".

The nozzle plate 62 is a plate-shaped member in which a plurality of nozzles N are formed, and is provided on the surface of the channel substrate 32 in the positive direction of the Z-axis. Each of the plurality of nozzles N is a circular through-hole through which ink passes. In the nozzle plate 62 according to Embodiment 1, a plurality of nozzles N constituting the first row L1 and a plurality of nozzles N constituting the second row L2 are formed. For example, the nozzle plate 62 is manufactured by processing a single crystal substrate of silicon by using a semiconductor manufacturing technique such as dry etching or wet etching. However, a well-known material and a well-known manufacturing method may be optionally employed for manufacturing the nozzle plate 62.

As illustrated in FIGS. 4 and 5, a space Ra, a plurality of supply channels 322, a plurality of communication channels 324, and a supply liquid chamber 326 are formed in the channel substrate 32 for each of the first row L1 and the second row L2. The space Ra is an opening formed in a long shape along the Y-axis in plan view from the direction of the Z-axis, and the supply channel 322 and the communication channel 324 are through-holes formed for each nozzle N. The supply liquid chamber 326 is a space formed in a long shape along the Y-axis over the plurality of nozzles N, and allows the space Ra and the plurality of supply channels 322 to communicate with each other. Each of the plurality of communication channels 324 overlaps one nozzle N corresponding to the communication channel 324 in plan view.

As illustrated in FIGS. 4 and 5, the pressure chamber substrate 34 is a plate-shaped member in which a plurality of pressure chambers C are formed for each of the first row L1 and the second row L2. The plurality of pressure chambers C are arranged along the Y-axis. Each pressure chamber C is formed for each nozzle N and has a long shaped space along the X-axis in plan view. The channel substrate 32 and the pressure chamber substrate 34 are manufactured by processing the single crystal substrate of silicon by using, for example, the semiconductor manufacturing technique, similarly to the above-described nozzle plate 62. However, a well-known material and a well-known manufacturing method may be optionally employed for manufacturing the channel substrate 32 and the pressure chamber substrate 34.

As illustrated in FIG. 4, the vibration plate 42 is formed on the surface of the pressure chamber substrate 34 opposite to the channel substrate 32. The vibration plate 42 according to Embodiment 1 is a plate-shaped member which can elastically vibrate. The vibration plate 42 includes an installation surface F0 which faces the wiring substrate 46. The installation surface F0 can be paraphrased as a surface of the channel structure 30. A part or all of the vibration plate 42 may be formed integrally with the pressure chamber substrate 34 by selectively removing a part of the plate-shaped member in a plate thickness direction among the plate-shaped member having a predetermined plate thickness in a region corresponding to the pressure chamber C.

As understood from FIG. 4, the pressure chamber C is a space positioned between the channel substrate 32 and the vibration plate 42. A plurality of pressure chambers C are arranged along the Y-axis for each of the first row L1 and the second row L2. As illustrated in FIGS. 4 and 5, the pressure chamber C communicates with the communication channel 324 and the supply channel 322. Therefore, the pressure chamber C communicates with the nozzle N through the communication channel 324, and also communicates with the space Ra through the supply channel 322 and the supply liquid chamber 326.

As illustrated in FIGS. 4 and 5, the plurality of piezoelectric elements 44 corresponding to different nozzles N are formed for each of the first row L1 and the second row L2 on the installation surface F0 which is on the side of the vibration plate 42 opposite to the pressure chamber C. Each piezoelectric element 44 is a drive element for causing ink to be ejected from the nozzle N by varying pressure in the pressure chamber C. Specifically, the piezoelectric element 44 is an actuator deformed by the supply of the drive signal COM, and is formed in a long shape along the X-axis in plan view. The plurality of piezoelectric elements 44 are arranged along the Y-axis so as to correspond to the plurality of pressure chambers C. That is, an array U1 of the plurality of piezoelectric elements 44 is formed for the first row L1, and an array U2 of the plurality of piezoelectric elements 44 is formed for the second row L2. The direction of the Y-axis is also paraphrased as a direction in which the plurality of piezoelectric elements 44 are arranged. The piezoelectric element 44 in the array U1 is an example of the "first drive element", and the piezoelectric element in the array U2 is an example of the "second drive element". When the vibration plate 42 vibrates in conjunction with deformation of the piezoelectric element 44, the pressure in the pressure chamber C is varied, so that the ink filled in the pressure chamber C is ejected through the communication channel 324 and the nozzle N.

The housing portion 48 is a casing for storing ink to be supplied to the plurality of pressure chambers C. As illustrated in FIG. 5, a space Rb is formed for each of the first row L1 and the second row L2 in the housing portion 48 according to Embodiment 1. The space Rb of the housing portion 48 and the space Ra of the channel substrate 32 communicate with each other. A space configured to include the space Ra and the space Rb functions as a liquid storage chamber R for storing the ink to be supplied to the plurality of pressure chambers C. The ink is supplied to the liquid storage chamber R through an inlet 482 formed in the housing portion 48. The ink in the liquid storage chamber R is supplied to the pressure chamber C through the supply liquid chamber 326 and each supply channel 322. The vibration absorber 64 is a flexible film constituting a wall surface of the liquid storage chamber R, and absorbs a variation in pressure of the ink in the liquid storage chamber R.

The wiring substrate 46 illustrated in FIG. 4 is a plate-shaped member facing the installation surface F0 of the vibration plate 42, on which the plurality of piezoelectric elements 44 are formed, with a gap. The wiring substrate 46 according to Embodiment 1 also functions as a reinforcing plate for reinforcing mechanical strength of the liquid ejecting head 26 and a sealing plate for protecting and sealing the piezoelectric element 44. The wiring substrate 46 is electrically coupled to the control unit 20 through an external wiring 52. The external wiring 52 is a flexible wiring substrate for supplying voltage and a signal generated by the control unit 20 to the wiring substrate 46 from the control unit 20. For example, coupling parts such as flexible printed circuits (FPC) or a flexible flat cable (FFC) are preferably employed as the external wiring 52.

The wiring substrate 46 includes a base portion 70 and a plurality of types of wiring 72. The base portion 70 is an insulating plate-shaped member which is long along the Y-axis, and is positioned between the channel structure 30 and the drive circuit 50. The base portion 70 is manufactured by processing the single crystal substrate of silicon by using, for example, the semiconductor manufacturing technique. However, a well-known material and a well-known manufacturing method may be optionally employed for manufacturing the base portion 70.

As illustrated in FIG. 4, the base portion 70 is a plate-shaped member including a first surface F1 and a second surface F2 positioned opposite to each other. The base portion 70 is an example of a "first substrate", and the second surface F2 is an example of a "mounting surface". The base portion 70 is provided so that the second surface F2 and the installation surface F0 in the channel structure 30 face each other with a gap. That is, the second surface F2 is a surface facing the channel structure 30. As illustrated in FIG. 4, the drive circuit 50 and the external wiring 52 are mounted on the first surface F1 of the base portion 70. The drive circuit 50 is an IC chip which is long along a longitudinal direction of the base portion 70. The external wiring 52 is mounted on an end portion of the first surface F1 of the base portion 70 in the negative direction of the Y-axis.

The plurality of types of wiring 72 for driving the plurality of piezoelectric elements 44 are formed on the first surface F1 and the second surface F2 of the base portion 70. Specifically, as illustrated in FIG. 2, wiring 72a through which a drive signal COM is supplied, wiring 72b through which a control signal S is supplied, and coupling wiring 72c through which a reference voltage Vbs is supplied are formed in the base portion 70. The drive signal COM is supplied to the drive circuit 50 through the wiring 72a, and the control signal S is supplied to the drive circuit 50 through the wiring 72b. On the other hand, the reference voltage Vbs is supplied to the plurality of piezoelectric elements 44 through the coupling wiring 72c without passing through the drive circuit 50.

Figure 6:
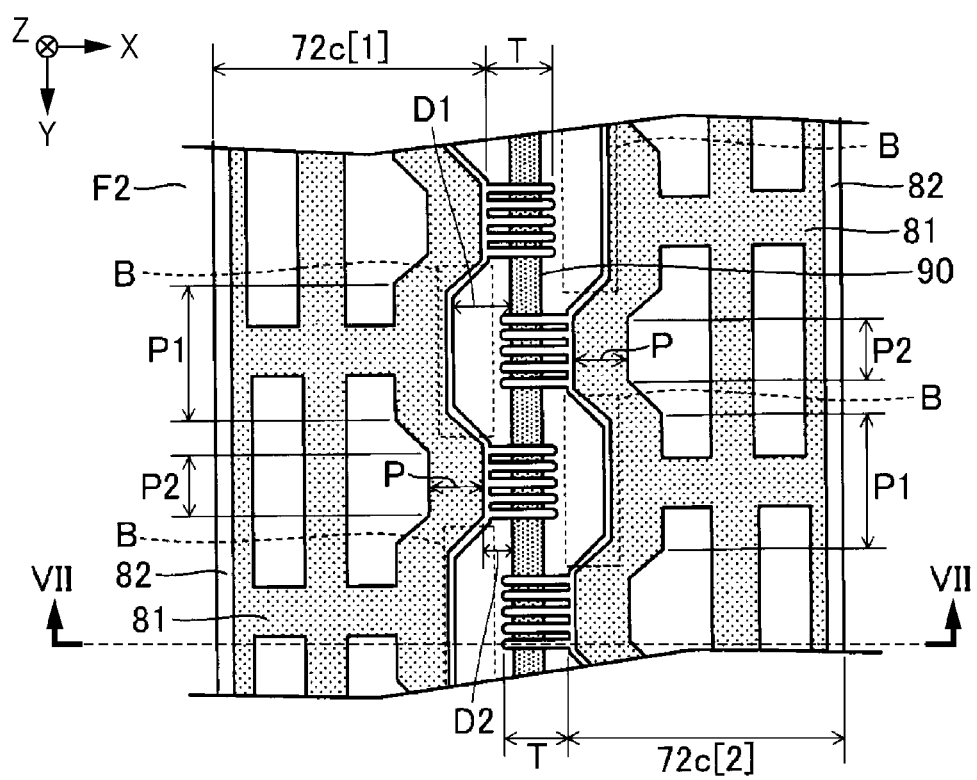
FIG. 6 is a plan view of wiring formed on a second surface of a base portion.
Figure 7:
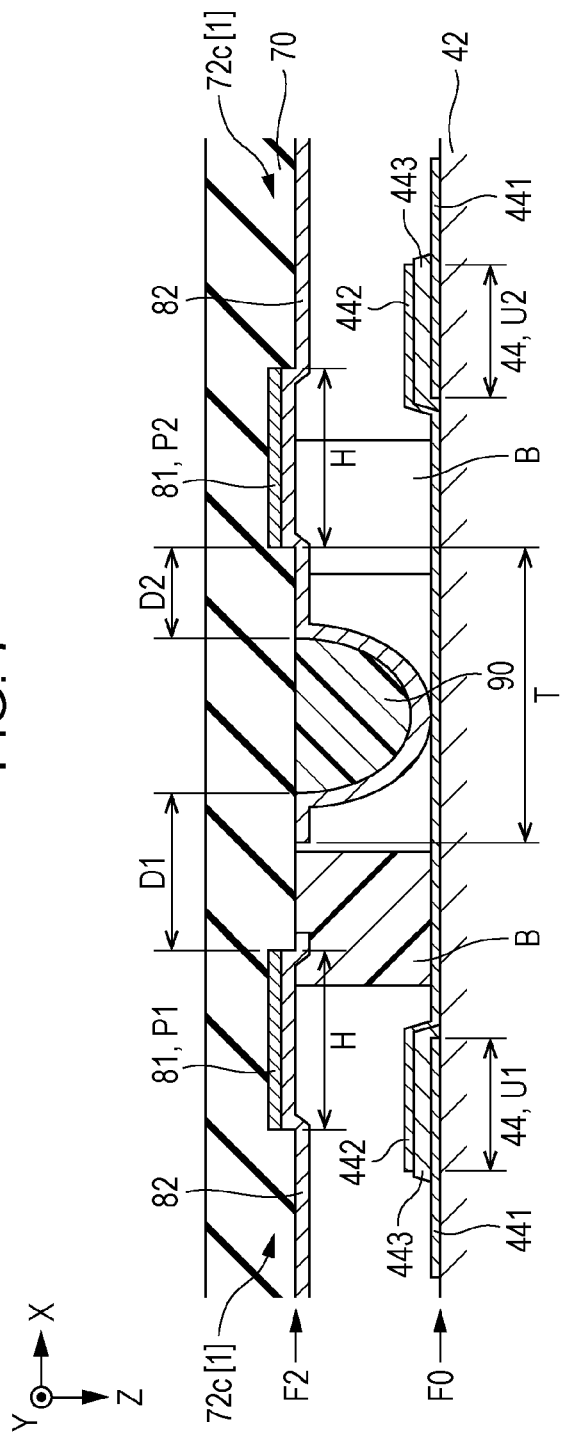
FIG. 7 is a cross-sectional view of wiring (a cross-sectional view taken along line VII-VII in FIG. 6).

FIG. 6 is a plan view of the coupling wiring 72c formed on the second surface F2, and FIG. 7 is a cross-sectional view taken along a line VII-VII in FIG. 6. As illustrated in FIG. 6, the second surface F2 includes two types of coupling wiring 72c. In the following description, one of the two types of coupling wiring 72c is represented as first coupling wiring 72c [1], and the other is represented as second coupling wiring 72c [2]. When it is not necessary to distinguish the first coupling wiring 72c [1] and the second coupling wiring 72c [2], they are represented as the "coupling wiring 72c". The first coupling wiring 72c [1] is formed for the array U1, and supplies the reference voltage Vbs to each piezoelectric element 44 in the array U1. On the other hand, the second coupling wiring 72c [2] is formed for the array U2, and supplies the reference voltage Vbs to each piezoelectric element 44 in the array U2.

As illustrated in FIGS. 6 and 7, the second surface F2 includes a protrusion portion 90. The protrusion portion 90 protrudes from the second surface F2 and is formed along the Y-axis. The protrusion portion 90 according to Embodiment 1 is formed of a resin material and is elastically deformable. A cross-sectional shape of the protrusion portion 90 is, for example, a semicircle. The first coupling wiring 72c [1] and the second coupling wiring 72c [2] are positioned opposite to each other with the protrusion portion 90 in between in plan view from the direction of the Z-axis. That is, the protrusion portion 90 is positioned between the first coupling wiring 72c [1] and the second coupling wiring 72c [2].

The coupling wiring 72c is a multilayer wiring configured with a stack of a plurality of conductive layers. As illustrated in FIG. 7, a groove H along the coupling wiring 72c is formed on the second surface F2 of the base portion 70. The groove H is a recessed portion having a rectangular cross-section recessed to the second surface F2 of the base portion 70. The coupling wiring 72c is configured by stacking a first layer 81 and a second layer 82. The first layer 81 is a conductive pattern formed of a low resistance metal such as copper (Cu). The first layer 81 is a trench wiring positioned inside the groove H. On the other hand, the second layer 82 is a conductive pattern covering the first layer 81. The second layer 82 covers the first layer 81 inside the groove H and continues to the second surface F2 of the base portion 70. That is, the second layer 82 is stacked on the first layer 81. Specifically, the second layer 82 is configured by stacking a close contact layer formed on the first layer 81 with a metal such as titanium (Ti) or tungsten (W) and a wiring layer formed on the close contact layer with a metal such as gold (Au). That is, the surface of the second layer 82 is formed of gold. However, the surface of the second layer 82 may be formed of a metal other than gold. The close contact layer is a conductive layer for improving close contact between the first layer 81 and the wiring layer. As described above, since the coupling wiring 72c formed in the base portion 70 includes the first layer 81 formed inside the groove H of the base portion 70, wiring resistance is reduced in comparison with a configuration in which the coupling wiring 72c is formed only by a conductive pattern formed on the second surface F2 of the base portion 70.

As illustrated in FIG. 6, the first layer 81 is partially formed in a region of the coupling wiring 72c. The second layer 82 is formed over the entirety of the region of the coupling wiring 72c. That is, the coupling wiring 72c includes a portion in which the first layer 81 and the second layer 82 are stacked, and a portion in which the second layer 82 contacts the second surface F2 without the first layer 81 being formed.

As illustrated in FIG. 6, the first layer 81 includes an extension portion P adjacent to the protrusion portion 90. The extension portion P is formed along the direction of the Y-axis in which the protrusion portion 90 extends. The extension portion P and the protrusion portion 90 are formed with a gap. The extension portion P includes a first portion P1 and a second portion P2. The extension portion P according to Embodiment 1 includes a plurality of first portions P1 and a plurality of second portions P2. The number of the first portions P1 and the number of the second portions P2 are optional. The first portion P1 is a linear portion along the Y-axis, and is adjacent to the protrusion portion 90 with a first gap D1 in the direction of the X-axis. The second portion P2 is a linear portion along the Y-axis, and is adjacent to the protrusion portion 90 with a second gap D2 in the direction of the X-axis. The second gap D2 is narrower than the first gap D1. That is, the second portion P2 is closer to the protrusion portion 90 than the first portion P1. In the following description, a region between the first portion P1 and the protrusion portion 90 is represented as an "adhesion region".

The first portion P1 and the second portion P2 are arranged alternately along the Y-axis. In Embodiment 1, the length in the direction of the Y-axis in the second portion P2 is smaller than the length in the direction of the Y-axis in the first portion P1. A length in the direction of the Y-axis in the second portion P2 is smaller than a length in the direction of the Y-axis in the first portion P1. A width in the direction of the X-axis in the first portion P1 is the same as a width in the direction of the X-axis in the second portion P2. The first portion P1 of the first coupling wiring 72c [1] and the second portion P2 of the second coupling wiring 72c [2] are positioned opposite to each other in plan view from the direction of the Z-axis with respect to the protrusion portion 90. That is, the first portion P1 of the first coupling wiring 72c [1] and the second portion P2 of the second coupling wiring 72c [2] are arranged in the direction of the X-axis with the protrusion portion 90 interposed therebetween. The second portion P2 of the first coupling wiring 72c [1] and the first portion P1 of the second coupling wiring 72c [2] are positioned opposite to each other in plan view from the direction of Z-axis with respect to the protrusion portion 90. That is, the second portion P2 of the first coupling wiring 72c [1] and the first portion P1 of the second coupling wiring 72c [2] are arranged in the direction of the X-axis with the protrusion portion 90 interposed therebetween.

The liquid ejecting head 26 includes a terminal portion T for supplying the reference voltage Vbs to the piezoelectric element 44 from the coupling wiring 72c. A plurality of terminal portions T are formed for each of the first coupling wiring 72c [1] and the second coupling wiring 72c [2]. The terminal portion T is formed in the same layer as the second layer 82. The terminal portion T may be formed of a material different from that of the second layer 82 when electrically coupled to the second layer 82. However, it is optimal that the terminal portion T and the second layer 82 are formed of the same material and in the same process.

The terminal portion T corresponding to the first coupling wiring 72c [1] extends in the positive direction of the X-axis from the position corresponding to the second portion P2 of the second layer 82 of the first coupling wiring 72c [1] toward the protrusion portion 90. The terminal portion T corresponding to the second coupling wiring 72c [2] extends in the negative direction of the X-axis from the position corresponding to the second portion P2 of the second layer 82 of the second coupling wiring 72c [2] toward the protrusion portion 90. That is, when attention is paid to each of the first coupling wiring 72c [1] and the second coupling wiring 72c [2], a position of the terminal portion T in the direction of the Y-axis is the same as the position of the second portion P2 in the direction of the Y-axis. The terminal portion T is formed for each of the plurality of second portions P2 in the coupling wiring 72c. That is, there are a plurality of second portions P2 and terminal portions T corresponding to the second portions P2 along the Y-axis. The terminal portion T connected to the second layer 82 of the first coupling wiring 72c [1] is an example of a "first terminal portion", and the terminal portion T connected to the second layer 82 of the second coupling wiring 72c [2] is an example of a "second terminal portion". The terminal portion T of the first coupling wiring 72c [1] and the terminal portion T of the second coupling wiring 72c [2] are arranged alternately along the Y-axis.

The terminal portion T continues to the surface of the protrusion portion 90 from the position corresponding to the second portion P2 in the second layer 82. That is, the terminal portion T overlaps the protrusion portion 90 in plan view. Specifically, the terminal portion T overlaps the protrusion portion 90 between the first coupling wiring 72c [1] and the second coupling wiring 72c [2]. As illustrated in FIG. 7, the terminal portion T is formed over an entire surface of the protrusion portion 90 in a cross-sectional view. The terminal portion T in the first coupling wiring 72c [1] extends to the adhesion region opposite to the first coupling wiring 72c [1] with respect to the protrusion portion 90 from the position corresponding to the second portion P2 of the first coupling wiring 72c [1]. That is, a tip end of the terminal portion T in the first coupling wiring 72c [1] is positioned in the adhesion region between the first portion P1 and the protrusion portion 90 of the second coupling wiring 72c [2]. The tip end of the terminal portion T in the first coupling wiring 72c [1] does not contact the second coupling wiring 72c [2]. Similarly, the terminal portion T in the second coupling wiring 72c [2] extends to the adhesion region opposite to the second coupling wiring 72c [2] with respect to the protrusion portion 90 from the position corresponding to the second portion P2 of the second coupling wiring 72c [2].

As illustrated in FIG. 6, the terminal portion T includes a plurality of partial electrodes along the X-axis intersecting the first axis. The plurality of partial electrodes are formed with a gap in the direction of the X-axis. That is, the terminal portion T has a comb shape.

In FIG. 7, the cross-section of the piezoelectric element 44 is illustrated. As illustrated in FIG. 7, the piezoelectric element 44 is a stacked body in which a first electrode 441, a piezoelectric layer 443, and a second electrode 442 are stacked in the negative direction of the Z-axis. The first electrode 441 is an individual electrode formed for each piezoelectric element 44 on the installation surface F0 of the vibration plate 42. A drive signal COM for each piezoelectric element 44 is supplied to the first electrode 441. The piezoelectric layer 443 is formed of a ferroelectric piezoelectric material such as lead zirconate titanate. The second electrode 442 is a common electrode continuing over a plurality of piezoelectric elements 44. A predetermined reference voltage Vbs is applied to the second electrode 442. That is, voltage corresponding to a difference between the reference voltage Vbs and the drive signal COM is applied to the piezoelectric layer 443. A portion in which the first electrode 441, the second electrode 442, and the piezoelectric layer 443 overlap in plan view functions as a piezoelectric element 44. When the vibration plate 42 vibrates in conjunction with the deformation of the piezoelectric element 44, pressure of ink in the pressure chamber C is varied, and the ink filled in the pressure chamber C is ejected to an outside through the communication channel 324 and the nozzle N. A configuration in which the first electrode 441 is a common electrode and the second electrode 442 is an individual electrode for each piezoelectric element 44, or a configuration in which both the first electrode 441 and the second electrode 442 are individual electrodes may also be employed.

As illustrated in FIG. 7, the terminal portion T contacts the second electrode 442 of the piezoelectric element 44. Specifically, a portion on the surface of the protrusion portion 90 of the terminal portion T contacts the second electrode 442. That is, the reference voltage Vbs is supplied to the second electrode 442 from the coupling wiring 72c through the terminal portion T. Specifically, the terminal portion T in the first coupling wiring 72c [1] contacts the second electrode 442 of the piezoelectric element 44 in the array U1, and the terminal portion T in the second coupling wiring 72c [2] contacts the second electrode 442 of the piezoelectric element 44 in the array U2.

As illustrated in FIGS. 6 and 7, the liquid ejecting head 26 includes an adhesion layer B for bonding the channel structure 30 and the base portion 70. The adhesion layer B interposes between the second surface F2 and the installation surface F0. For example, the adhesion layer B is formed of a photosensitive resin material. The adhesion layer B is formed in a range including an adhesion region in plan view from the direction of the Z-axis. That is, the adhesion layer B is positioned between the first portion P1 and the protrusion portion 90. As illustrated in FIG. 6, a plurality of adhesion layers B are formed in a plurality of adhesion regions respectively. The adhesion layer B according to Embodiment 1 overlaps a part of the coupling wiring 72c in plan view in addition to the adhesion region.

As illustrated in FIG. 7, a surface of the adhesion layer B on the base portion 70 side includes a portion contacting the second surface F2 in the adhesion region and a portion contacting the second layer 82 of the coupling wiring 72c. On the other hand, a surface of the adhesion layer B on the vibration plate 42 side contacts the second electrode 442 of the piezoelectric element 44 formed on the installation surface F0. As understood from the above description, an "interposition" of the adhesion layer B between the second surface F2 and the installation surface F0 may include a interposition of other elements such as the second electrode 442 between the second surface F2 and the adhesion layer B or between the installation surface F0 and the adhesion layer B in addition to a state in which the adhesion layer B directly contacts both the second surface F2 and the installation surface F0.

Figure 8:
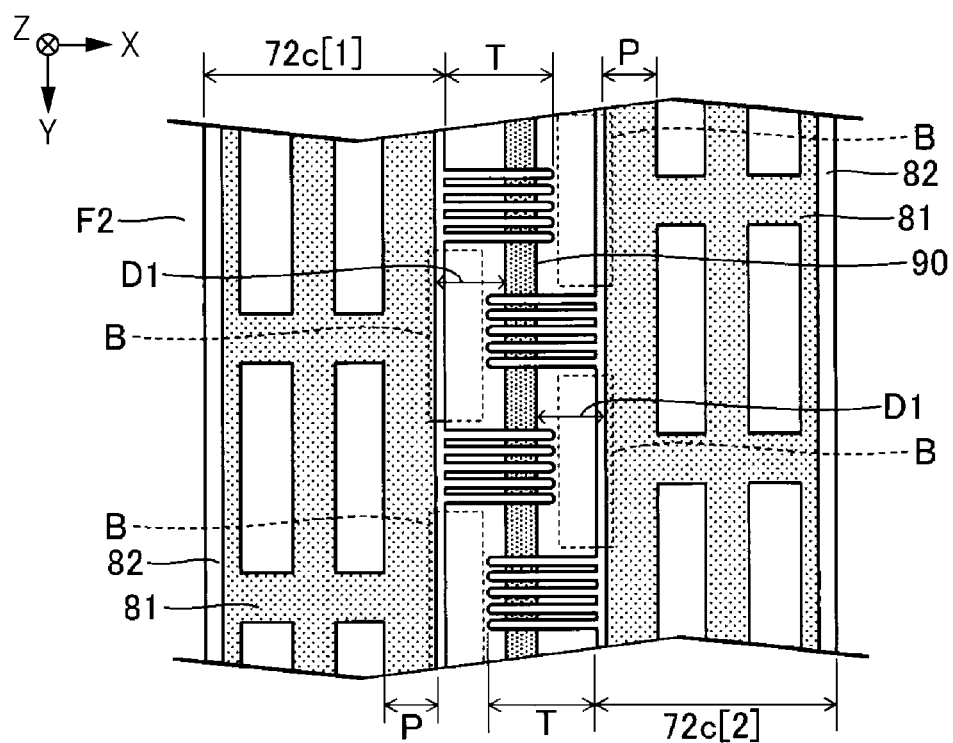
FIG. 8 is a cross-sectional view of wiring in Comparative Example 1.

Here, as illustrated in FIG. 8, a configuration (hereinafter referred to as "Comparative Example 1") in which the extension portion P is adjacent to the protrusion portion 90 at a constant first gap D1 over the whole is assumed. In Comparative Example 1, although the region to which the adhesive for bonding the second surface F2 and the installation surface F0 is applied can be sufficiently ensured, a length of the terminal portion T in the direction of the X-axis is increased. Therefore, there is a problem that resistance between the coupling wiring 72c and the second electrode 442 increases.

Figure 9:
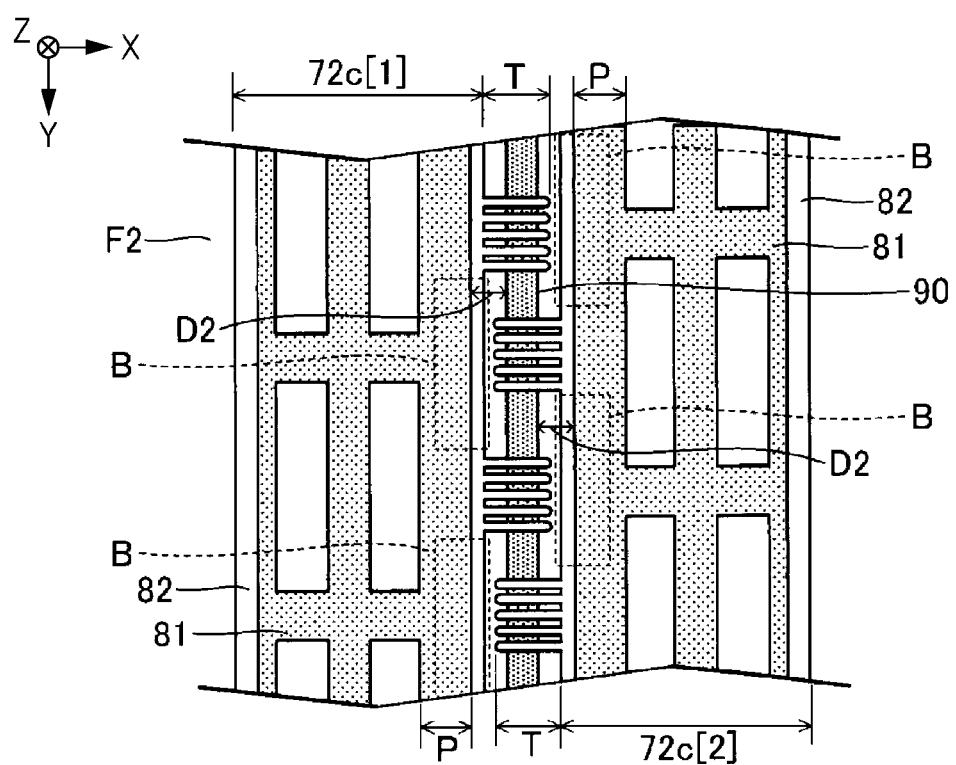
FIG. 9 is a cross-sectional view of wiring in Comparative Example 2.

On the other hand, FIG. 9 illustrates a configuration (hereinafter referred to as "Comparative Example 2") in which the extension portion P is adjacent to the protrusion portion 90 at a constant second gap D2 over the whole. In Comparative Example 2, although the length of the terminal portion T in the direction of the X-axis is smaller than that of Comparative Example 1, a region forming the adhesion layer B between the protrusion portion 90 and the extension portion P cannot be sufficiently ensured. Specifically, an area of the adhesion layer B which contacts the second surface F2 is smaller than that of Comparative Example 1.

With respect to Comparative Example 1 and Comparative Example 2, in Embodiment 1, the extension portion P of the coupling wiring 72c includes the first portion P1 adjacent to the protrusion portion 90 at the first gap D1 and the second portion P2 adjacent to the protrusion portion 90 at the second gap D2 narrower than the first gap D1, the terminal portion T is formed on the surface of the protrusion portion 90 from the position corresponding to the second portion P2 in the second layer 82. Therefore, the adhesion region in which the adhesion layer B is disposed can be sufficiently ensured while reducing the length of the terminal portion T in the direction of the X-axis. That is, the channel structure 30 and the base portion 70 can be bonded with sufficient strength without increasing the resistance between the coupling wiring 72c and the second electrode 442.

According to a configuration of Embodiment 1 in which the first portion P1 and the second portion P2 are alternately positioned along the Y-axis, since the adhesion region can be ensured on the opposite side to each other with the terminal portion T interposed therebetween along the Y-axis, the channel structure 30 and the base portion 70 can be bonded with sufficient strength. In Embodiment 1, since the terminal portion T includes a plurality of partial electrodes provided with a gap, the terminal portion T is easily deformed in comparison with a configuration in which the terminal portion T is formed in a solid-state. Therefore, there is an advantage that the terminal portion T is easy to contact the second electrode 442.

In Embodiment 1, since the adhesion layer B can be arranged in the adhesion region, the adhesion layer B contacts the second surface F2 in the adhesion region. Therefore, the channel structure 30 and the base portion 70 can be bonded with sufficient strength. Since the adhesion layer B overlaps the coupling wiring 72c in plan view, the channel structure 30 and the base portion 70 can be bonded with sufficient strength in comparison with a configuration in which the adhesion layer B is disposed only in the adhesion region. Since the second layer 82 formed of gold has low close contact to the adhesion layer B, the adhesion layer B and the second layer 82 cannot be bonded with sufficient strength when the adhesion layer B is formed on the surface of the second layer 82. Therefore, when the second layer 82 is formed of gold, a configuration of Embodiment 1 in which the adhesion layer B is formed in the adhesion region is particularly preferable.

Since the first portion P1 and the second portion P2 have a same width in the direction of the X-axis, a variation in resistance of the coupling wiring in the direction of the Y-axis is reduced, for example, in comparison with a configuration in which the first portion P1 and the second portion P2 have different widths in the direction of the X-axis. Since the protrusion portion 90 according to Embodiment 1 is formed of the resin material and is elastically deformable, there is an advantage that the terminal portion T and the electrode are in sufficient contact with each other. Since the drive circuit 50 is mounted on the first surface F1 of the base portion 70, a path for supplying the reference voltage Vbs to the piezoelectric element 44 from the drive circuit 50 is shortened. Therefore, resistance between the drive circuit 50 and the piezoelectric element 44 is reduced.

The terminal portion T in the coupling wiring 72c extends to the adhesion region opposite to the coupling wiring 72c with respect to the protrusion portion 90 from the position corresponding to the second portion P2 of the coupling wiring 72c. Therefore, a contact area between the terminal portion T and the second electrode can be sufficiently ensured.

Each effect in Embodiment 1 described above is realized for the first coupling wiring 72c [1] and the second coupling wiring 72c [2] respectively. In Embodiment 1, since the liquid ejecting head 26 includes the first coupling wiring 72c [1] and the second coupling wiring 72c [2], the reference voltage Vbs can be individually supplied to the first coupling wiring 72c [1] and the second coupling wiring 72c [2]. Therefore, by driving one of the piezoelectric element 44 in the array U1 and the piezoelectric element 44 in the array U2, a variation in the reference voltage Vbs corresponding to the other can be suppressed.

B. Embodiment 2

Embodiment 2 will be described. For elements whose functions are similar to Embodiment 1 in the following examples, reference numerals used in the description of Embodiment 1 are diverted to appropriately omit each detailed description.

Figure 10:
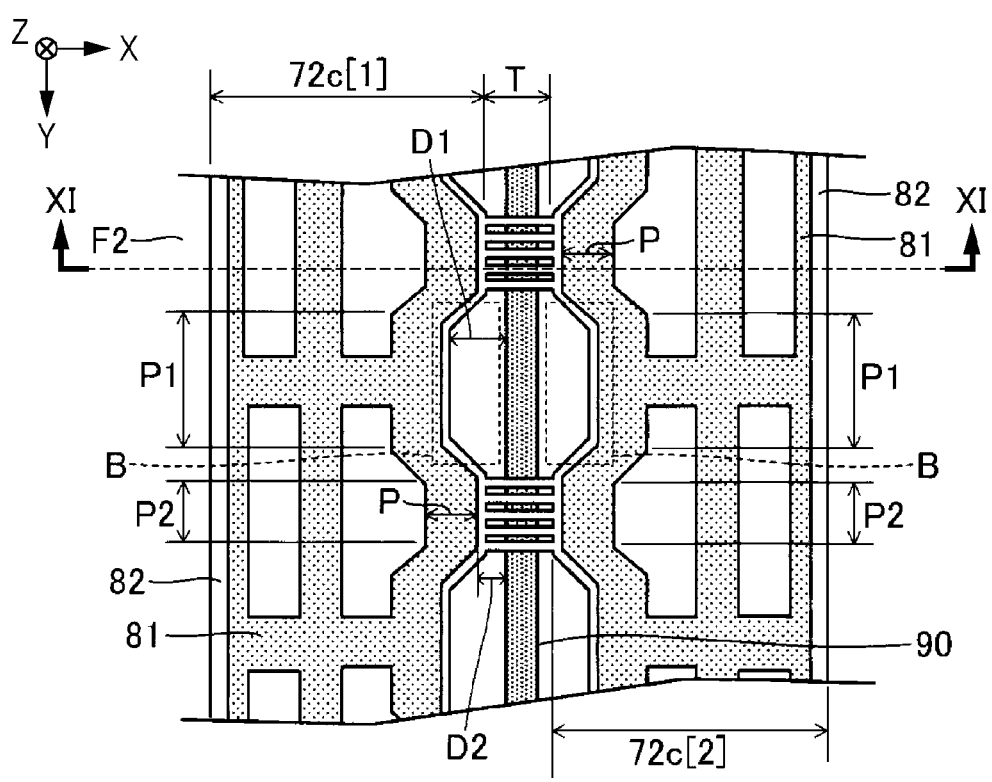
FIG. 10 is a plan view of wiring according to Embodiment 2.
Figure 11:
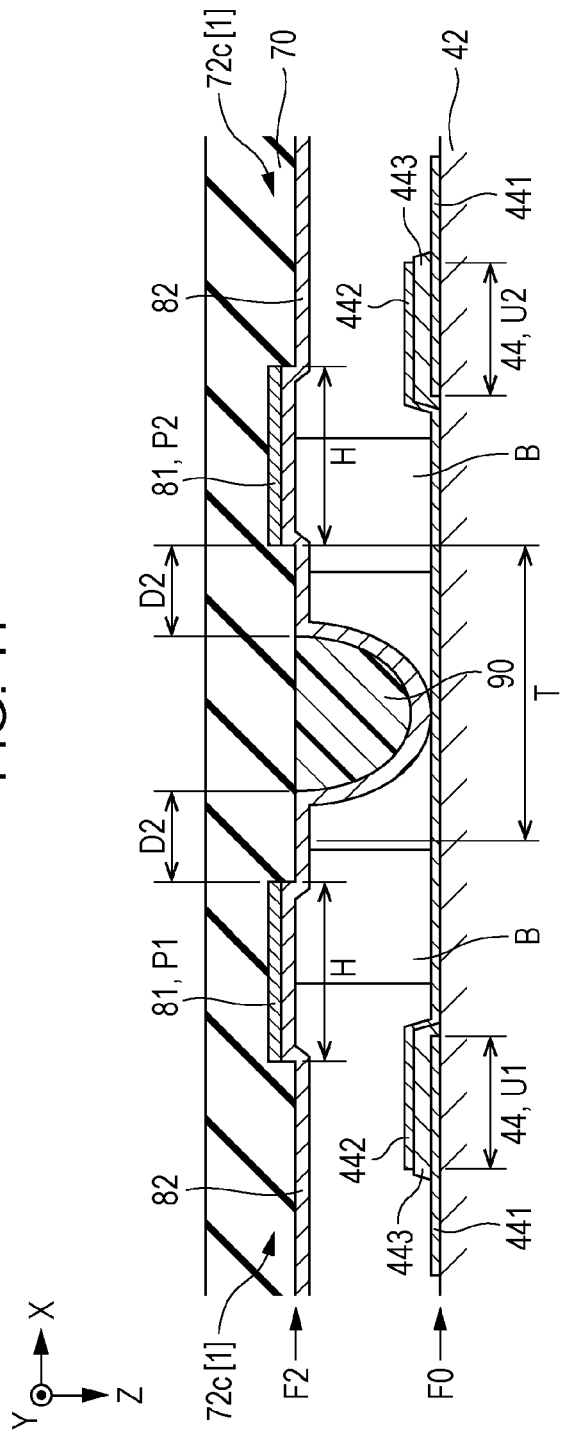
FIG. 11 is a cross-sectional view of wiring.

In Embodiment 1, the configuration in which the reference voltage Vbs is supplied to the piezoelectric element 44 from either of the first coupling wiring 72c [1] and the second coupling wiring 72c [2] is illustrated. However, in Embodiment 2, a configuration in which the reference voltage Vbs is supplied to the piezoelectric element 44 from both the first coupling wiring 72c [1] and the second coupling wiring 72c [2] is illustrated. FIG. 10 is a plan view of the coupling wiring 72c according to Embodiment 2, and FIG. 11 is a cross-sectional view taken along a line XI-XI in FIG. 10.

As illustrated in FIG. 10, the first coupling wiring 72c [1] and the second coupling wiring 72c [2] are positioned opposite to each other in plan view from the direction of the Z-axis with respect to the protrusion portion 90. In Embodiment 2, the first portion P1 of the first coupling wiring 72c [1] and the first portion P1 of the second coupling wiring 72c [2] are positioned opposite to each other with the protrusion portion 90 in between in plan view, and the second portion P2 of the first coupling wiring 72c [1] and the second portion P2 of the second coupling wiring 72c [2] are positioned opposite to each other with the protrusion portion 90 in between in plan view. That is, the first portion P1 of the first coupling wiring 72c [1] and the first portion P1 of the second coupling wiring 72c [2] are arranged in the direction of the X-axis with the protrusion portion 90 interposed therebetween, and the second portion P2 of the first coupling wiring 72c [1] and the second portion P2 of the second coupling wiring 72c [2] are arranged in the direction of the X-axis with the protrusion portion 90 interposed therebetween.

The terminal portion T according to Embodiment 2 continues over the position corresponding to the second portion P2 of the first coupling wiring 72c [1] in the second layer 82 of the first coupling wiring 72c [1], and the position corresponding to the second portion P2 of the second coupling wiring 72c [2] in the second layer 82 of the second coupling wiring 72c [2]. That is, the first coupling wiring 72c [1] and the second coupling wiring 72c [2] are electrically coupled through the terminal portion T. As illustrated in FIG. 11, the portion on the surface of the protrusion portion 90 of the terminal portion T contacts the second electrode 442 of the piezoelectric element 44. Therefore, the reference voltage Vbs is supplied to the piezoelectric element 44 from both the first coupling wiring 72c [1] and the second coupling wiring 72c [2]. Similar to Embodiment 1, the adhesion layer B is formed in the adhesion region in the first coupling wiring 72c [1] and the adhesion region in the second coupling wiring 72c [2].

Also in Embodiment 2, the same effect as in Embodiment 1 is realized. In Embodiment 2, since the reference voltage Vbs is supplied to the piezoelectric element 44 from both the first coupling wiring 72c [1] and the second coupling wiring 72c [2], the amount of current flowing through each of the first coupling wiring 72c [1] and the second coupling wiring 72c [2] can be reduced, for example, in comparison with Embodiment 1 in which the reference voltage Vbs is supplied to the piezoelectric element 44 from either of the first coupling wiring 72c [1] and the second coupling wiring 72c [2]. The amount of generated heat can also be reduced by reducing the amount of current flowing.

C. Modified Example

Each embodiment illustrated above can be variously deformed. Specific aspects of deformation that can be applied to each embodiment described above will be illustrated below. Two or more aspects optionally selected from the following illustrations can be appropriately merged as long as they do not contradict each other.

(1) In each of the above-described embodiments, the adhesion layer B is formed in each of the plurality of adhesion regions. However, the adhesion layer B may be continuously formed over the plurality of adhesion regions. For example, the adhesion layer B may be formed along the Y-axis over each adhesion region of the first coupling wiring 72c [1], and the adhesion layer B may be formed along the Y-axis over each adhesion region of the second coupling wiring 72c [2]. The adhesion layer B may be formed over the adhesion region of the first coupling wiring 72c [1] and the adhesion region of the second coupling wiring 72c [2] as well.

(2) In each of the above-described embodiments, a configuration in which the terminal portion T includes the partial electrode is illustrated. However, the terminal portion T may be a single electrode formed in a solid-state. When the terminal portion T overlaps the protrusion portion 90 in plan view, the shape of the terminal portion T is optional.

Figure 12:
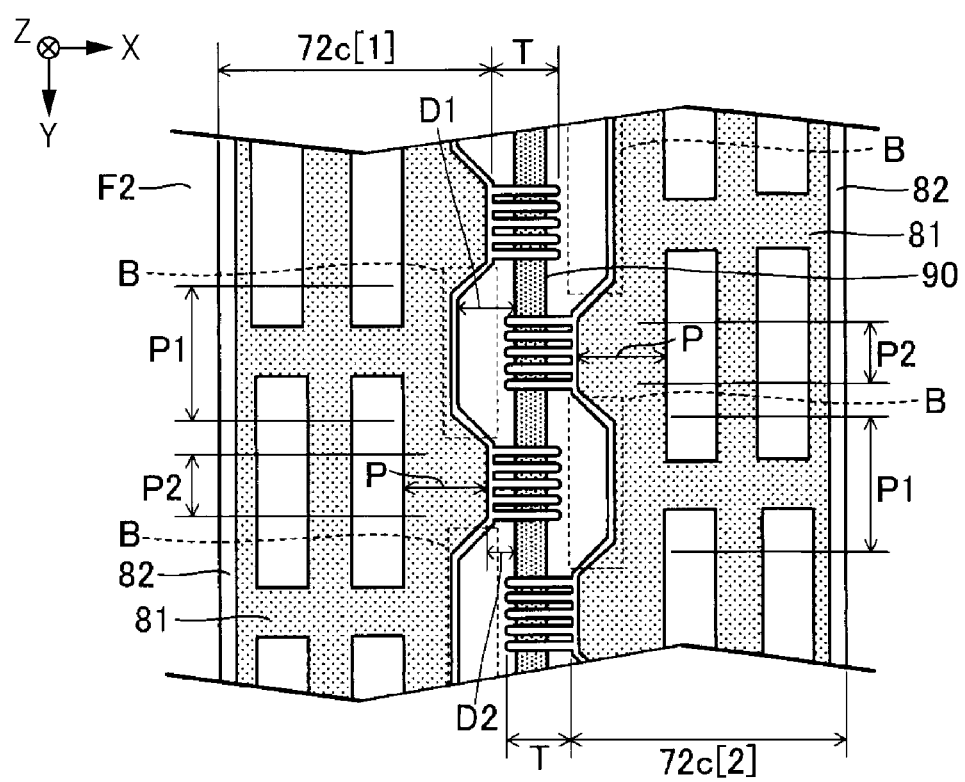
FIG. 12 is a plan view of wiring according to Modified Example.

(3) In each of the above-described embodiments, the configuration in which the width in the direction of the X-axis in the first portion P1 and the width in the direction of the X-axis in the second portion P2 are illustrated. However, the width in the direction of the X-axis in the first portion P1 and the second portion P2 may be different. For example, as illustrated in FIG. 12, a configuration in which the width in the direction of the X-axis in the second portion P2 is larger than the width in the direction of the X-axis in the first portion P1 is also employed. Specifically, the peripheral edge along the Y-axis on the opposite side of the protrusion portion 90 in the extension portion P is continuously linearly formed over the first portion P1 and the second portion P2.

(4) In each of the above-described embodiments, the coupling wiring 72c may include an annular portion. For example, the annular coupling wiring 72c may be formed by coupling wiring formed on the first surface F1 and wiring formed on the second surface F2 to each other through the through-hole of the base portion 70. The annular coupling wiring 72c may be formed on the second surface F2 of the base portion 70. According to the above configuration, since resistance of the coupling wiring 72c is reduced, a voltage drop on the coupling wiring 72c is suppressed.

(5) In each of the above-described embodiments, two types of coupling wiring 72c are formed for one protrusion portion 90. However, a configuration in which one coupling wiring 72c is formed for one protrusion portion 90 is also employed. In each of the above-described embodiments, a configuration in which one protrusion portion 90 is formed over a plurality of terminal portions T along the Y-axis in the coupling wiring 72c is illustrated. However, one protrusion portion 90 may be formed in each terminal portion T.

(6) The drive element for causing liquid to be ejected in the pressure chamber C from the nozzle N is not limited to the piezoelectric element 44 illustrated in each of the above-described embodiments. For example, it is possible to use a heating element, as a drive element, which generates air bubbles in the pressure chamber C by heating to vary the pressure. As understood from the above illustration, the drive element is comprehensively expressed as an element for causing the liquid in the pressure chamber C to be ejected from the nozzle N, regardless of an operation method such as a piezoelectric method and a heat method and a specific configuration.

(7) The liquid ejecting apparatus 100 illustrated in each of the above-described embodiments can be employed in various kinds of apparatuses such as a facsimile apparatus and a copying machine in addition to apparatuses dedicated to printing. However, the usage of the liquid ejecting apparatus is not limited to printing. For example, the liquid ejecting apparatus for ejecting a solution of a color material is used as a manufacturing apparatus which forms a color filter of a display device such as a liquid crystal display panel. A liquid ejecting apparatus for ejecting a solution of a conductive material is used as a manufacturing apparatus which forms wiring and electrodes of a wiring substrate. In addition, a liquid ejecting apparatus for ejecting an organic solution related to a living body is used as a manufacturing apparatus which manufactures a biochip, for example.

(8) The liquid ejecting head 26 illustrated in each of the above-described embodiments is an example of an electronic device. Examples of electronic devices other than the liquid ejecting head 26 include [a] an ultrasonic device such as an ultrasonic cleaner, an ultrasonic diagnostic apparatus, an ultrasonic oscillator, or an ultrasonic motor, [b] Various filters such as a filter for blocking harmful rays such as infrared rays, an optical filter using a photonic crystal effect by quantum dot formation, or an optical filter using optical interference of a thin film, [c] Various sensors such as an infrared sensor, an ultrasonic sensor, a thermal sensor, a pressure sensor, a pyroelectric sensor, or an angular velocity sensor, [d] Various other devices such as a temperature-electric converter, a pressure-electric converter, a ferroelectric transistor, or a piezoelectric transformer. The present disclosure is applied to any electronic device including a structure in which a first substrate and a second substrate are joined.

What is claimed is:

1. A liquid ejecting head comprising:
   a first substrate including a mounting surface;
   a protrusion portion provided on the mounting surface along a first axis;
   coupling wiring provided on the mounting surface;
   a second substrate including an installation surface facing the mounting surface with a gap;
   a drive element provided on the installation surface and causing liquid to be ejected from a nozzle; and
   at least one terminal portion overlapping the protrusion portion in plan view, wherein
   the coupling wiring includes an extension portion that extends along the first axis so as to include a first portion and a second portion,
   the first portion and the second portion are disposed at different positions along the first axis,
   a gap along a second axis that is orthogonal to the first axis between the first portion and the protrusion portion is a first gap,
   a gap along the second axis between the second portion and the protrusion portion is a second gap that is narrower than the first gap,
   the terminal portion extends from a part on a surface of the protrusion portion to a part corresponding to the second portion, and
   the part on the surface of the protrusion portion is in contact with an electrode of the drive element.

2. The liquid ejecting head according to claim 1, wherein the at least one second portion includes a plurality of second portions and the at least one terminal portion includes a plurality of terminal portions corresponding to the second portions, and
   the second portions and the terminal portions are provided along the first axis.

3. The liquid ejecting head according to claim 1, wherein the terminal portion extends to a region on a side of the protrusion portion opposite to the coupling wiring from the part corresponding to the second portion.

4. The liquid ejecting head according to claim 1, wherein the coupling wiring includes part positioned inside a groove formed on the mounting surface.

5. The liquid ejecting head according to claim 1, wherein the first portion and the second portion are alternately positioned along the first axis.

6. The liquid ejecting head according to claim 1, wherein the coupling wiring includes annular part.

7. The liquid ejecting head according to claim 1, wherein the terminal portion includes a plurality of partial electrodes along the second axis with a gap along the first axis.

8. The liquid ejecting head according to claim 1, further comprising
   an adhesion layer interposed between the mounting surface and the installation surface, wherein
   the adhesion layer is positioned between the first portion and the protrusion portion in plan view.

9. The liquid ejecting head according to claim 8, wherein the adhesion layer overlaps the coupling wiring in plan view.

10. The liquid ejecting head according to claim 1, wherein the coupling wiring includes a first layer including an extension portion adjacent to the protrusion portion and a second layer stacked on the first layer,
    the first layer includes the extension portion, and
    the second layer includes the part corresponding to the second portion.

11. The liquid ejecting head according to claim 1, wherein a width of the first portion is equal to a width of the second portion.

12. The liquid ejecting head according to claim 1, wherein the protrusion portion is formed of a resin material and is elastically deformable.

13. The liquid ejecting head according to claim 1, further comprising
a drive circuit which is mounted on a surface of the first substrate opposite to the mounting surface and drives the drive element.

14. A liquid ejecting head comprising:
a first substrate including a mounting surface;
a protrusion portion provided on the mounting surface along a first axis;
first coupling wiring and second coupling wiring provided on the mounting surface and positioned opposite to each other with the protrusion portion in between in plan view;
a second substrate including an installation surface facing the mounting surface with a gap;
a first drive element provided on the installation surface and causing liquid to be ejected from a first nozzle;
a second drive element provided on the installation surface and causing liquid to be ejected from a second nozzle; and
a first terminal portion and a second terminal portion which overlap the protrusion portion in plan view between the first coupling wiring and the second coupling wiring, wherein
the first coupling wiring and the second coupling wiring each include an extension portion that extends along the first axis so as to include a first portion and a second portion,
the first portion and the second portion of the first coupling wiring are disposed at different positions along the first axis,
the first portion and the second portion of the second coupling wiring are disposed at different positions along the first axis,
a second axis is orthogonal to the first axis,
a gap along the second axis between each first portion of the first or second coupling wiring and the protrusion portion is a first gap,
a gap along the second axis between each second portion of the first or second coupling wiring and the protrusion portion is a second gap that is narrower than the first gap,
the first portion of the first coupling wiring and the second portion of the second coupling wiring are positioned opposite to each other with the protrusion portion in between in plan view,
the second portion of the first coupling wiring and the first portion of the second coupling wiring are positioned opposite to each other with the protrusion portion in between in plan view,
the first terminal portion extends from a first part on a surface of the protrusion portion to a part corresponding to the second portion of the first coupling wiring,
the first part on the surface of the protrusion portion is in contact with an electrode of the first drive element, and
the second terminal portion extends from a second part on the surface of the protrusion portion to a part corresponding to the second portion of the second coupling wiring, and
the second part on the surface of the protrusion portion is in contact with an electrode of the second drive element.

15. A liquid ejecting head comprising:
a first substrate including a mounting surface;
a protrusion portion provided on the mounting surface along a first axis;
first coupling wiring and second coupling wiring provided on the mounting surface and positioned opposite to each other with the protrusion portion in between in plan view;
a second substrate including an installation surface facing the mounting surface with a gap;
a drive element provided on the installation surface and causing liquid to be ejected from a nozzle; and
a terminal portion which overlaps the protrusion portion in plan view between the first coupling wiring and the second coupling wiring, wherein
the first coupling wiring and the second coupling wiring each include an extension portion that extends along the first axis so as to include a first portion and a second portion,
the first portion and the second portion of the first coupling wiring are disposed at different positions along the first axis,
the first portion and the second portion of the second coupling wiring are disposed at different positions along the first axis,
a second axis is orthogonal to the first axis,
a gap along the second axis between each first portion of the first or second coupling wiring and the protrusion portion is a first gap,
a gap along the second axis between each second portion of the first or second coupling wiring and the protrusion portion is a second gap that is narrower than the first gap,
the first portion of the first coupling wiring and the first portion of the second coupling wiring are positioned opposite to each other with the protrusion portion in between in plan view,
the second portion of the first coupling wiring and the second portion of the second coupling wiring are positioned opposite to each other with the protrusion portion in between in plan view,
the terminal portion extends among a part corresponding to the second portion of the first coupling wiring, a part corresponding to the second portion of the second coupling wiring, and a part on a surface of the protrusion portion, and
the part on the surface of the protrusion portion is in contact with an electrode of the drive element.

16. A liquid ejecting apparatus comprising:
the liquid ejecting head according to claim 1; and
a controller which controls the liquid ejecting head.

17. The liquid ejecting head according to claim 1, wherein a position of the first portion in the second axis is different from a position of the second portion in the second axis.

18. The liquid ejecting head according to claim 10, wherein
the second layer includes a layer formed of gold.

* * * * *